United States Patent
Lin et al.

(10) Patent No.: US 9,368,552 B2
(45) Date of Patent: Jun. 14, 2016

(54) RESISTIVE MEMORY ARRAY AND FABRICATING METHOD THEREOF

(71) Applicant: TAIWAN SEMICONDUCTOR MANUFACTURING CO., LTD., Hsinchu (TW)

(72) Inventors: Ku-Feng Lin, New Taipei (TW); Hung-Chang Yu, HsinChu (TW); Kai-Chun Lin, Hsinchu (TW); Yue-Der Chih, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 134 days.

(21) Appl. No.: 14/087,782

(22) Filed: Nov. 22, 2013

(65) Prior Publication Data
US 2015/0144860 A1    May 28, 2015

(51) Int. Cl.
*H01L 27/24* (2006.01)
*H01L 45/00* (2006.01)

(52) U.S. Cl.
CPC ........ *H01L 27/2463* (2013.01); *H01L 27/2409* (2013.01); *H01L 27/2436* (2013.01); *H01L 45/04* (2013.01); *H01L 45/1233* (2013.01); *H01L 45/146* (2013.01); *H01L 45/16* (2013.01)

(58) Field of Classification Search
CPC ............ H01L 27/2409; H01L 27/2436; H01L 27/2463; H01L 27/2472; H01L 45/16
See application file for complete search history.

(56) References Cited

U.S. PATENT DOCUMENTS

| | | | | |
|---|---|---|---|---|
| 6,391,658 B1* | 5/2002 | Gates | ..................... | B82Y 10/00 257/E21.568 |
| 7,470,598 B2* | 12/2008 | Lee | ..................... | H01L 21/2007 257/E21.122 |
| 7,927,911 B2* | 4/2011 | Breitwisch | .......... | H01L 27/2409 257/2 |
| 8,203,175 B2* | 6/2012 | Kuroda | ................... | H01L 21/74 257/295 |

* cited by examiner

*Primary Examiner* — Allison P Bernstein
(74) *Attorney, Agent, or Firm* — McDermott Will & Emery LLP

(57) ABSTRACT

A method of fabricating a resistive memory array includes forming a plurality of insulators and a conductive structure on a first substrate, performing a resistor-forming process to transform the insulators into a plurality of resistors, polishing the conductive structure to expose a plurality of contact points respectively electrically connected to the resistors, providing a second substrate having a plurality of transistors and a plurality of interconnect pads, bonding respectively the interconnect pads and the contact points, and removing the first substrate from the resistors and the conductive structure.

19 Claims, 14 Drawing Sheets

RESISTIVE MEMORY ARRAY AND FABRICATING METHOD THEREOF

BACKGROUND

Semiconductor memory devices for storing data may be classified into volatile memory devices and non-volatile memory devices. The volatile memory devices are typically configured to store data by charging or discharging capacitors in memory cells, and widely applied as main memories of various electronic apparatus in operation. However, the application of the volatile memory devices are limited since the volatile memory devices retain stored data while power is supplied to the electronic apparatus and lose the stored data when the power is off. In addition, as continuous development of integrated circuit technology, the volatile memory devices face a technology difficulty in scaling down.

Therefore, the non-volatile memory devices, such as flash memory devices and resistive memory devices, have attracted the attention of many researchers. In particular to the resistive memory devices, which have the advantages of compatible with the existing transistors process, are considered as a key candidate for advanced technology in 20 nm or narrower nodes. The resistive memory devices are formed of an array of resistors with resistive elements where each element has two or more stable resistive states. Voltage pulses, which are controlled by the transistors electrically connected to the resistive elements, are typically used to switch the resistive elements from one resistance state to the other. A resistor-forming process applied to the resistive elements is necessary to initialize the resistive memory devices since materials of the resistive elements are inherently insulating. Through the resistor-forming process, conductive pathways will be respectively formed in the resistive elements, so that a high resistance state or a low resistance state of the resistive elements is formed for the data-storing applications.

However, with the increasing requirements of data storing, the amount of resistive elements of the resistive memory array significantly increases in the manufacturing process. The time required to complete the resistor-forming process extends, and the current/voltage required to perform the resistor-forming process also increases. Therefore, it raises the risk of damaging the transistors, which are electrically connected to resistive elements. The issue of reliability of each resistive element of the resistive memory array becomes worse under this circumstance. Accordingly, improvements in methods of fabricating a resistive memory array continue to be sought.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a", "an" and "the" used herein include plural referents unless the context clearly dictates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Conventionally, the transistors, which are electrically connected to resistive elements, are fabricated with the resistors of the resistive memory array in a stacked structure before the resistor-forming process is performed on the resistors of the resistive memory array. However, if the time required in completing the resistor-forming process extends, and/or the current/voltage required in performing the resistor-forming process increases. The risk of damaging the transistors is elevated, and the reliability of each resistive element of the resistive memory array is worsened. In this regard, a method of fabricating a resistive memory array is provided according to various embodiments of the present disclosure.

Figure 1:
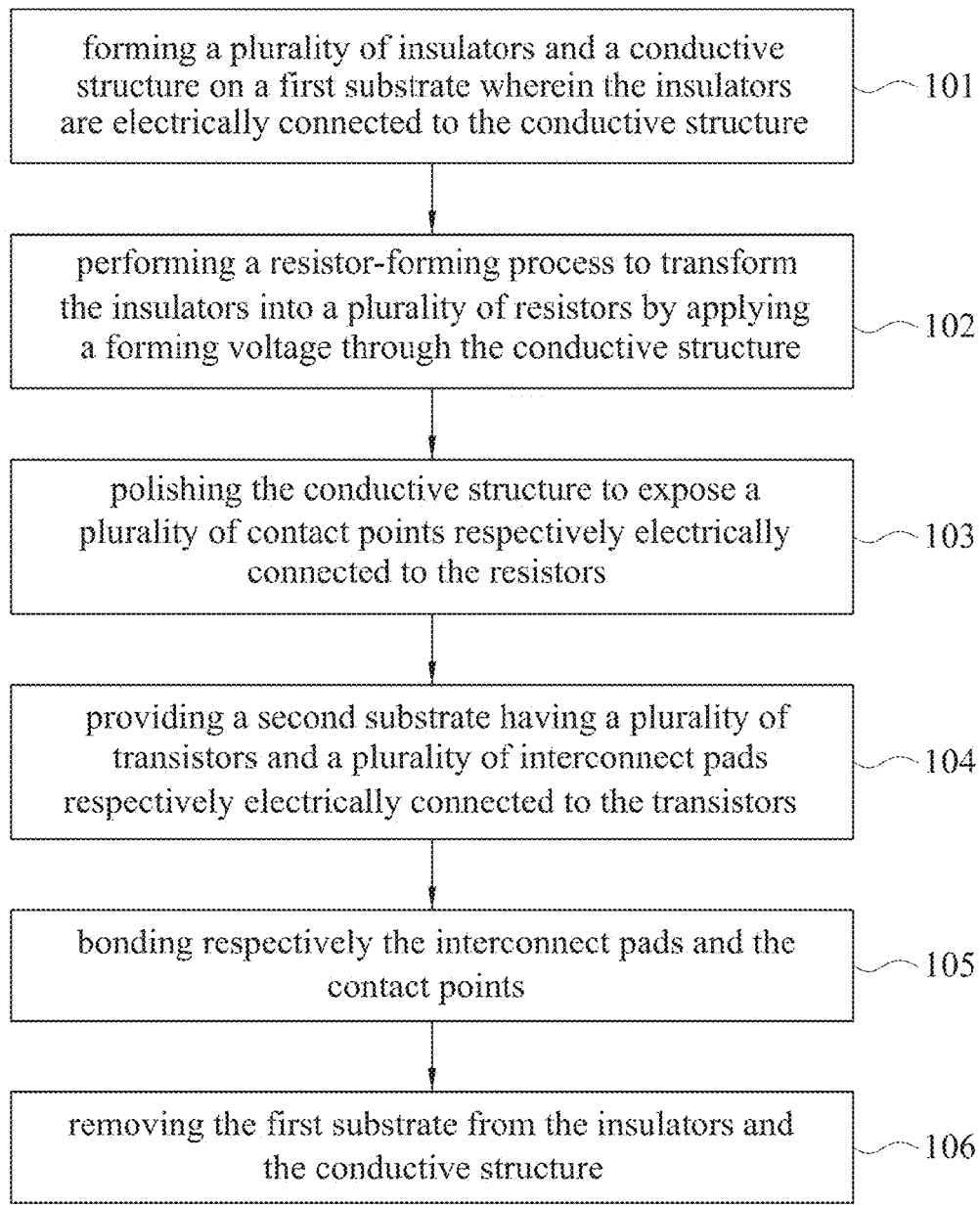
FIG. 1 is a flowchart illustrating a method of fabricating a resistive memory array according to various embodiments of the present disclosure.

Referring to FIG. 1, FIG. 1 is a flowchart illustrating a method of fabricating a resistive memory array according to various embodiments of the present disclosure. The method 100 begins with block 101 in which a plurality of insulators and a conductive structure are formed on a first substrate. The insulators are electrically connected to the conductive structure. The method continues with block 102 in which a resistor-forming process is performed to transform the insulators into a plurality of resistors by applying a forming voltage through the conductive structure. Next, the method includes polishing the conductive structure to expose a plurality of contact points respectively electrically connected to the resistors as shown in block 103. The method 100 continues with block 104 in which a second substrate is provided. The second substrate has a plurality of transistors and a plurality of interconnect pads. The interconnect pads are respectively electrically connected to the transistors. Next, the method includes bonding respectively the interconnect pads and the contact points as shown in block 105. For example, the layout of the plurality of interconnect pads on the second substrate may be designed to correspond to the layout of the plurality of contact points on the first substrate, so as to bond the plurality of interconnect pads and the plurality of contact points respectively. The method 100 continues with block 106 in which the first substrate is removed from the plurality of resistors and the conductive structure. In other words, the first substrate may be regarded as a carrier substrate for the plurality of resistors and the conductive structure. When the resistors are respectively electrically connected to the transistors by respectively bonding the interconnect pads (on the second substrate) and the contact points (on the first substrate), then the first substrate is removed to leave a resistive memory array on the second substrate.

Figure 2:
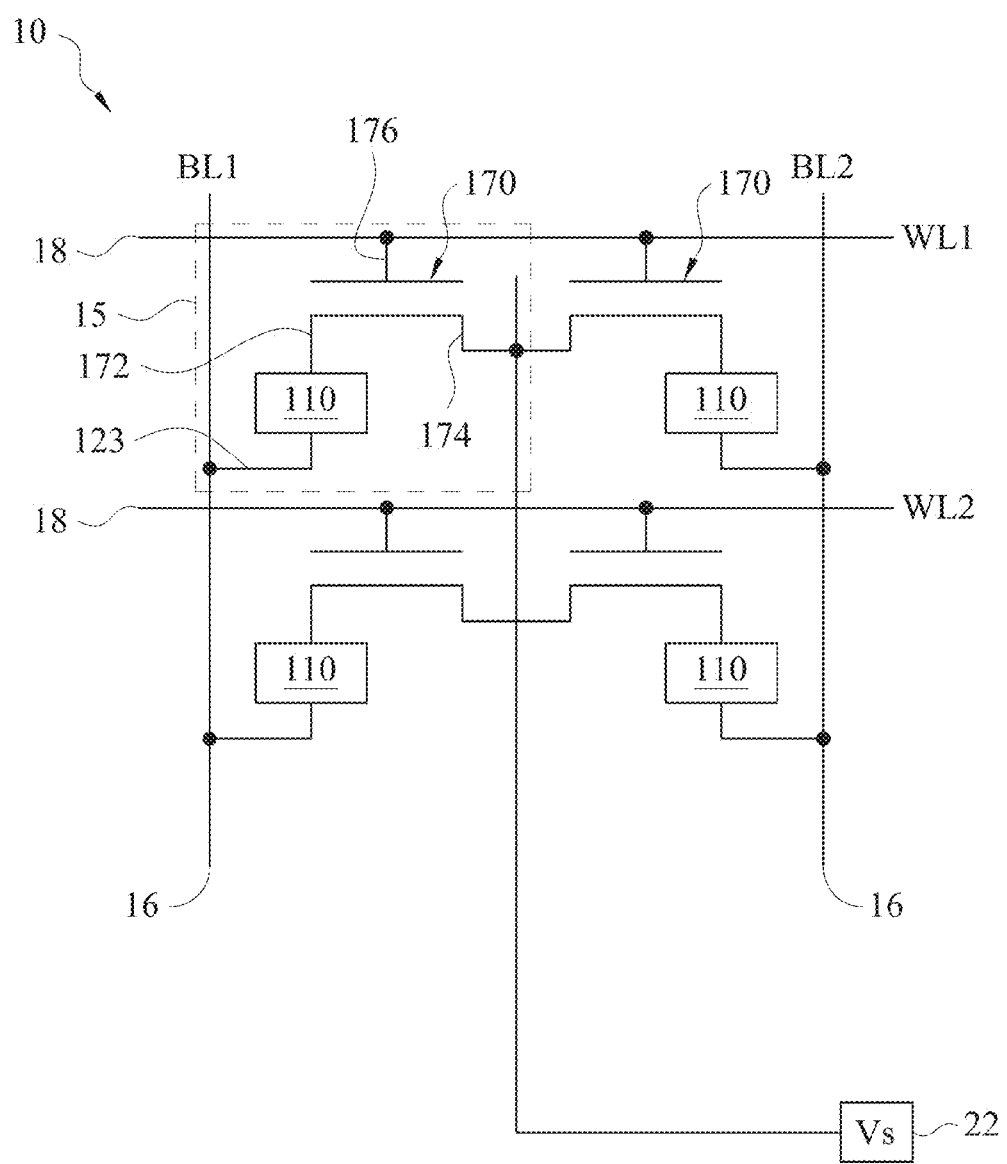
FIG. 2 illustrates an equivalent circuit diagram of a resistive memory array according to various embodiments of the present disclosure.

FIG. 2 illustrates an equivalent circuit diagram of a resistive memory array according to various embodiments of the present disclosure. A 4 bit 1T1R resistive memory array 10 is shown in FIG. 2. Two word lines 18 (labeled WL1-WL2) and two bit lines 16 (labeled BL1-BL2) are illustrated. Each bit 15 (indicated by dashed lines) is formed by a transistor 170 and a resistor 110, and may be referred to as a 1-transistor, 1-resistor memory bit, or a 1T1R memory bit. Each transistor 170 has a gate 176, which is connected to one of the word lines 18. The resistor 110 is electrically connected between a drain 172 of a transistor 170 and a bit line 16. The transistor 170 has a source electrode 174 electrically connected to a common source 22 (labeled Vs).

The method for fabricating a resistive memory array according to various embodiments of the present disclosure will now be described in conjunction with FIG. 3-8.

Figure 3:
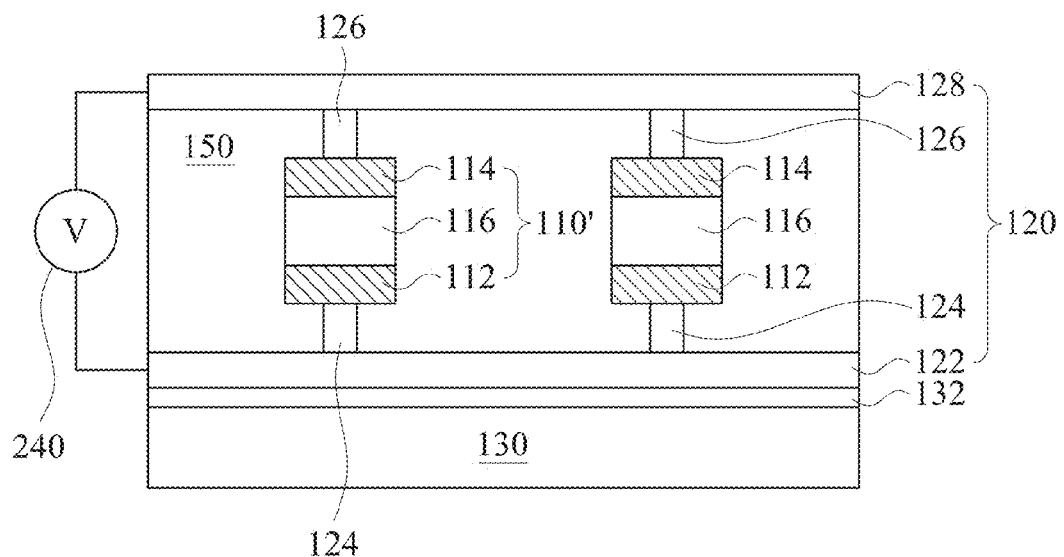
FIG. 3 is a schematic view of at least a portion of a resistive memory array in an intermediate stage of manufacturing according to various embodiments of the present disclosure.

Referring to FIG. 3, FIG. 3 is a schematic view of a portion of a resistive memory array in an intermediate stage of manufacturing according to various embodiments of the present disclosure. As illustrated in FIG. 3, a plurality of insulators 110' and a conductive structure 120 are formed on a first substrate 130. The plurality of insulators 110' is electrically connected to the conductive structure 120. In various embodiments of the present disclosure, the insulator 110' includes a first electrode 112, a second electrode 114, and a resistive element 116 disposed between the first electrode 112 and the second electrode 114. The conductive structure 120 includes the first conductive layer 122, the first vias 124, the second vias 126, and the second conductive layer 128. In various embodiments of the present disclosure, the operation of forming the plurality of insulators 110' and the conductive structure 120 on the first substrate 130 may include several steps to form the insulators 110' and the conductive structure 120 as illustrated in FIG. 3. First, the first conductive layer 122 is formed on the first substrate 130. A passivation film 132 may be optionally disposed between the first conductive layer 122 and the first substrate 130 for convenience on removing the first substrate 130 from the conductive structure 120 in the following step. A passivation film 132 may be silicon oxide or other suitable materials. Next, the plurality of first vias 124 is formed on the first conductive layer 122. The plurality of first vias 124 is electrically connected to the first conductive layer 122. The plurality of insulators 110' is formed on the plurality of first vias 124. The plurality of insulators 110' is electrically connected to the plurality of first vias 124 respectively. The plurality of second vias 126 is formed on the plurality of insulators 110. The plurality of second vias 126 is electrically connected to the plurality of insulators 110 respectively. The second conductive layer 128 is formed on the plurality of second vias 126 and electrically connected to the plurality of second vias 126. The formation of the conductive structure 120 (including the first conductive layer 122, the first vias 124, the second vias 126, and the second conductive layer 128) and the insulators 110' (including the first electrode 112, the second electrode 114, and the resistive element 116) can be sequentially performed by thin films deposition coped with litho-etching processes. For example, the first conductive layer 122 may be formed on the first substrate 130 by suitable processes, such as CVD, PVD, electrochemical plating (ECP). The first conductive layer 122 may be comprised of aluminum (Al), tungsten (W), copper (Cu), or other suitable conductive materials. The plurality of first vias 124 may be formed by depositing a conductive film such as aluminum (Al), tungsten (W), copper (Cu), or other suitable conductive materials. A photo resist mask may be formed on the conductive film to delineate where the plurality of first vias 124 is desired. The conductive film is then etched with a suitable etchant. The photo resist mask is then stripped, and the plurality of first vias 124 is formed as shown in FIG. 3. A dielectric film may be deposited to protect and isolated each of the plurality of first vias 124. Similarly, the fabrication of the first electrodes 112, the resistive elements 116, the second electrodes 114, and the plurality of second vias 126 may be also formed as the plurality of first vias 124 being formed. The plurality of second vias 126 may be made of conductive materials such as aluminum (Al), tungsten (W), copper (Cu), or other suitable conductive materials. The first electrode 112 and the second electrode 114 of the plurality of insulators 110' may be made of conductive materials such as tantalum nitride (TaN), titanium nitride (TiN), silicon-chrome (SiCr), tantalum (Ta), titanium (Ti) or combinations thereof. The resistive element 116 of the plurality of insulators 110' may be made of suitable dielectric transition metal oxides such as titanium dioxide ($TiO_2$), nickel oxide (NiO), hafnium dioxide ($HfO_2$) or combinations thereof. A dielectric film 150 is accordingly formed to protect and isolate each of the plurality of first vias 124, each of the plurality of second vias 126, and each of the plurality of insulators 110'. The dielectric film 150 may be made of silicon oxide, silicon nitride, or a combination thereof, and may be formed by suitable processes, such as CVD, PVD, ALD, HDPCVD, MOCVD, RPCVD, PECVD, PLD, other suitable techniques, or combinations thereof. As shown in FIG. 3, in various embodiments of the present disclosure, the insulators 110' are electrically connected in parallel by the conductive structure 120.

Referring to FIG. 3, a resistor-forming process is performed to transform the insulators 110' into a plurality of resistors 110 by applying a forming voltage 240 through the conductive structure 120. In various embodiments of the present disclosure, the operation of performing the resistor-forming process is performed by applying the forming voltage 240 through the first conductive layer 122 and the second conductive layer 128. As aforementioned, the insulators 110' are electrically connected in parallel by the conductive structure 120. While applying the forming voltage 240 through the first conductive layer 122 and the second conductive layer 128, a voltage difference is formed between the first electrode 112 and the second electrode 114 of each insulator 110.

Figure 4:
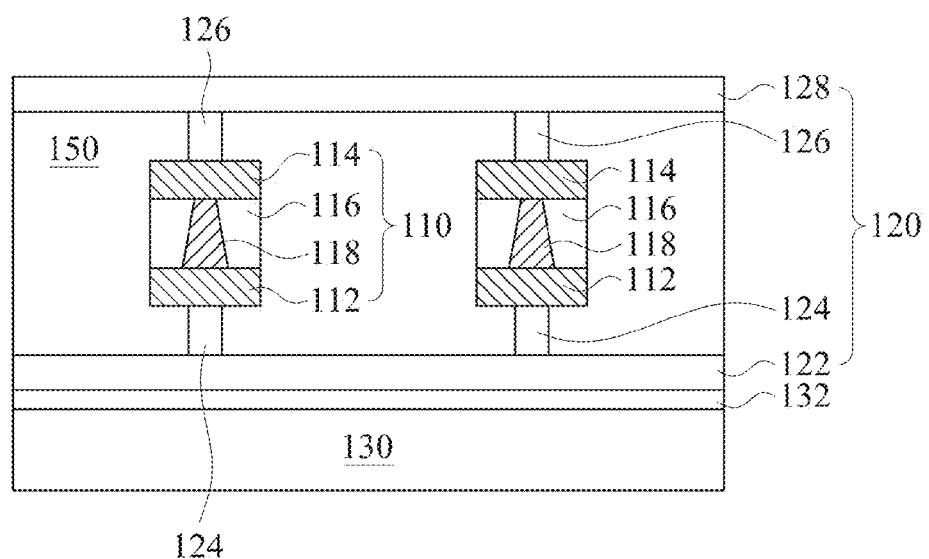
FIG. 4 is a schematic view of the portion of the resistive memory array shown in FIG. 3 in a subsequent stage of manufacture according to various embodiments of the present disclosure.

FIG. 4 is a schematic view of the portion of the resistive memory array shown in FIG. 3 in a subsequent stage of manufacture according to various embodiments of the present disclosure. As shown in FIG. 4, the resistor-forming process is completed, and the insulators 110' are transformed into the resistors 110. To be more specific, the resistor-forming process is a process that the resistive element 116 of the resistor 110 is transferred into its low resistance state for the first time. The resistor-forming process is performed by applying a voltage, called the forming voltage, across two electrodes (the first electrode 112 and the second electrode 114) of the resistor 110, so as to form one or more conductive pathways 118 in the resistive element 116. Conductive pathways 118 formed during the forming process reduce the resistance of the resistive switching element. Once the resistor-forming process is complete, a certain voltage, called the reset voltage, applied across the two electrodes (the first electrode 112 and the second electrode 114) will reset the conductive pathways 118 in the resistive element 116, thereby increasing the resistance of the resistive element 116. Another voltage, called the set voltage, applied across the two electrodes (the first electrode 112 and the second electrode 114) will reform the conductive pathways 118 in the resistive element 116, thereby reducing the resistance of the resistive element 116. A cell of the resistive memory array may be regarded as storing a logical bit; where the resistive switching element has increased resistance, the cell of the resistive memory array may be regarded as storing a "0" bit; where the resistive switching element has reduced resistance, the cell of the resistive memory array may be regarded as storing a "1" bit. Other circuitry, known in the art, reads the resistive state of the resistive switching element by applying a read voltage to the two electrodes and measuring the corresponding current through the resistive switching element. Where the current through the resistive switching element is greater than some predetermined baseline current, the resistive switching element must be in a reduced resistance state, and therefore the cell of the resistive memory array is storing a logical "1;" where the current through the resistive switching element is less than some predetermined baseline current, the resistive switching element must be in an increased resistance state, and therefore the cell of the resistive memory array is storing a logical "0." The read voltage is typically some predetermined voltage, less than the set voltage, the reset voltage and the forming voltage. The read voltage must be sufficient to determine the resistive state of the resistive switching element, but must not alter the conductive pathways of the resistive switching element. A typical forming voltage for a resistive element is approximately seven volts while the set voltage and reset voltage are typically lower than the forming voltage. Therefore, the forming voltage applied to a resistor may damage the transistor which is electrically connected thereto. It should be noticed that the transistors are not electrically connected to the resistors on the current stage according to the methods of fabricating a resistive memory array of the present disclosure. Therefore, the risk of damaging the transistor during the resistor-forming process is avoided.

Figure 5:
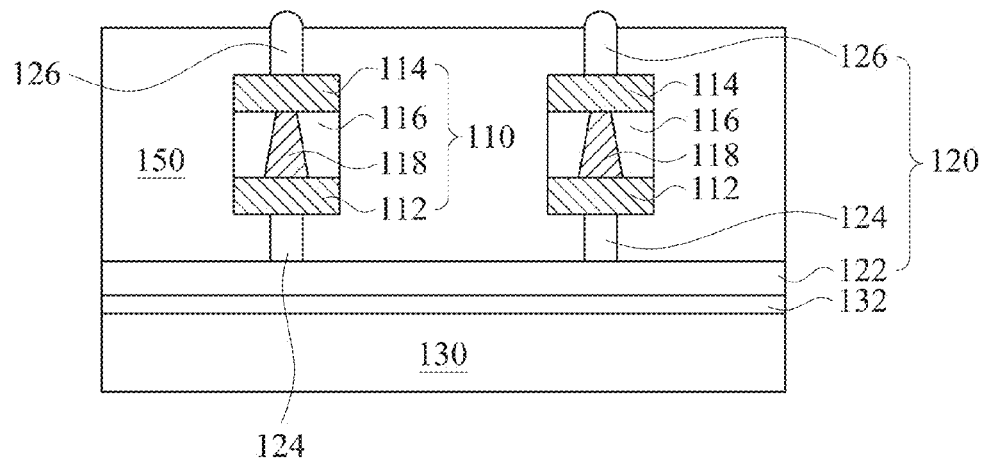
FIG. 5 is a schematic view of the portion of the resistive memory array shown in FIG. 4 in a subsequent stage of manufacture according to various embodiments of the present disclosure.

FIG. 5 is a schematic view of the portion of the resistive memory array shown in FIG. 4 in a subsequent stage of manufacture according to various embodiments of the present disclosure. The conductive structure 120 is polished to expose a plurality of contact points respectively electrically connected to the resistors. As illustrated in FIG. 5, in various embodiments of the present disclosure, the operation of polishing the conductive structure is performed by polishing the second conductive layer 128 away to expose the vias 126 as the contact points. The second conductive layer 128, as an upper common electrical connection of the plurality of the insulators 110', offers a common conductive path for applying the forming voltage 240 to each of the plurality of insulators 110' in the former stage (as illustrated in FIG. 3). After the plurality of insulators 110' is formed and transformed into the plurality of resistors 110 (as illustrated in FIG. 4), the second conductive layer 128 is polished away to leave individual conductive path for each of the plurality of resistors 110. The second conductive layer 128 may be polished by copper chemical mechanical polishing (CMP) process when the second conductive layer 128 is made of copper. However, the present disclosure is not limited thereto. As shown in FIG. 5, half of a 1T1R (one transistor to one resistive) memory array (the 1R part) is formed, and the combination is performed in the following stage.

Figure 6:
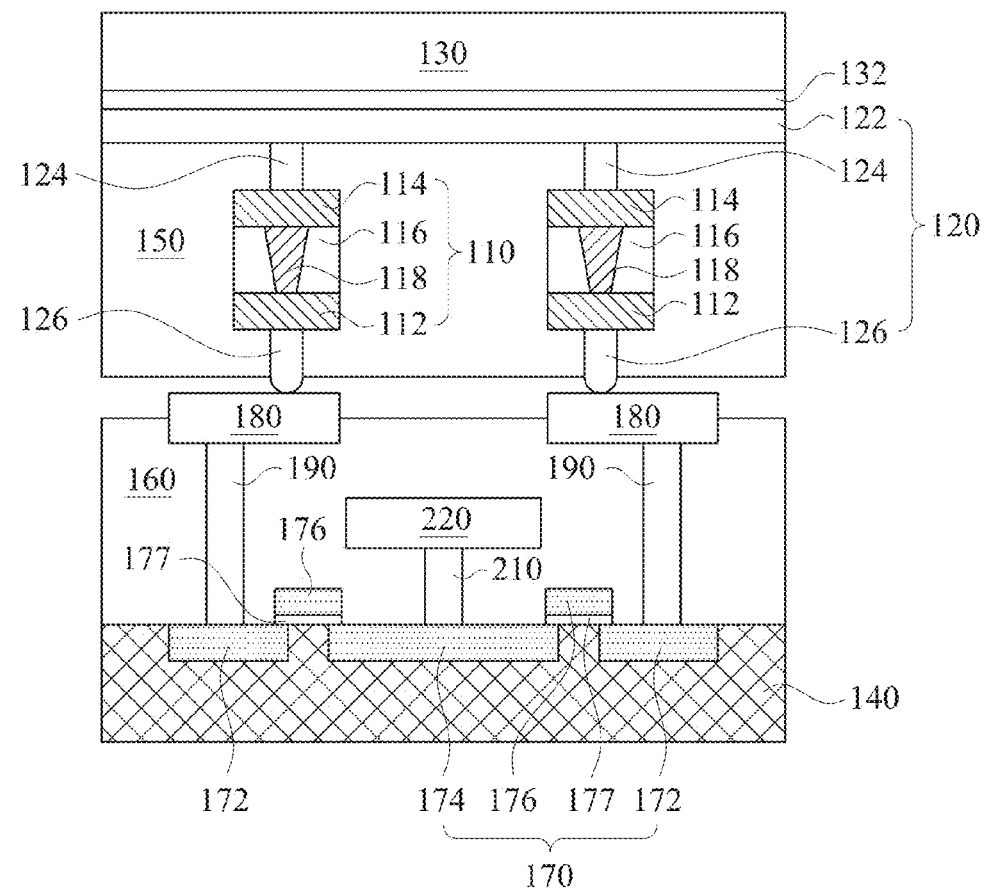
FIG. 6 is a schematic view of the portion of the resistive memory array shown in FIG. 5 in a subsequent stage of manufacture according to various embodiments of the present disclosure.

FIG. 6 is a schematic view of the portion of the resistive memory array shown in FIG. 5 in a subsequent stage of manufacture according to various embodiments of the present disclosure. A second substrate 140 is provided. The second substrate 140 has a plurality of transistors 170 and a plurality of interconnect pads 180. The interconnect pads 180 are respectively electrically connected to the plurality of transistors 170. The second substrate 140 may be comprised of silicon material or alternatively may include silicon germanium, gallium arsenic, or other suitable semiconductor materials. Referring to FIG. 6 and FIG. 2, each of the plurality of transistors 170 includes the gate electrode 176, the drain electrode 172 and the source electrode 174. A gate oxide layer 177 may be formed to separate below the gate electrode 176 from the drain electrode 172 and the source electrode 174 below the gate electrode 176. The gate oxide layer 177 serves as the dielectric layer so that the gate electrode 176 can sustain high transverse electric field in order to strongly modulate the conductance of the channel. As shown in FIG. 6 and FIG. 2, the gate electrode 176 is electrically connected to a corresponding word line 18; the source electrode 174 is electrically connected to the common source 22 (labeled Vs), for example, through a source via 210 and a source-connecting pad 220. The plurality of interconnect pads 180 is electrically connected to the plurality of transistors 170 respectively, for example, through a pad-connecting via 190. As illustrated in FIG. 6, in various embodiments of the present disclosure, the plurality of interconnect pads 180 and the plurality of transistors 170 are formed at the same side of the second substrate 140. The plurality of transistors 170, the source via 210, the source-connecting pad 220, the pad-connecting via 190, and the plurality of interconnect pads 180 can be formed on the second substrate 140 by sequential thin films deposition coped with litho-etching processes. A dielectric film 160 is accordingly formed to protect and/or isolate each of aforementioned elements. The dielectric film 160 may be made of silicon oxide, silicon nitride, or a combination thereof, and may be formed by suitable processes, such as CVD, PVD, ALD, HDPCVD, MOCVD, RPCVD, PECVD, PLD, other suitable techniques, or combinations thereof. As illustrated in FIG. 6, the plurality of interconnect pads 180 is bonded to the plurality of contact points (the second vias) 126 respectively. Therefore, the electrical connection between the drain electrode 172 of the transistor 170 and the first electrode 112 of the resistor 110 is established.

Figure 7:
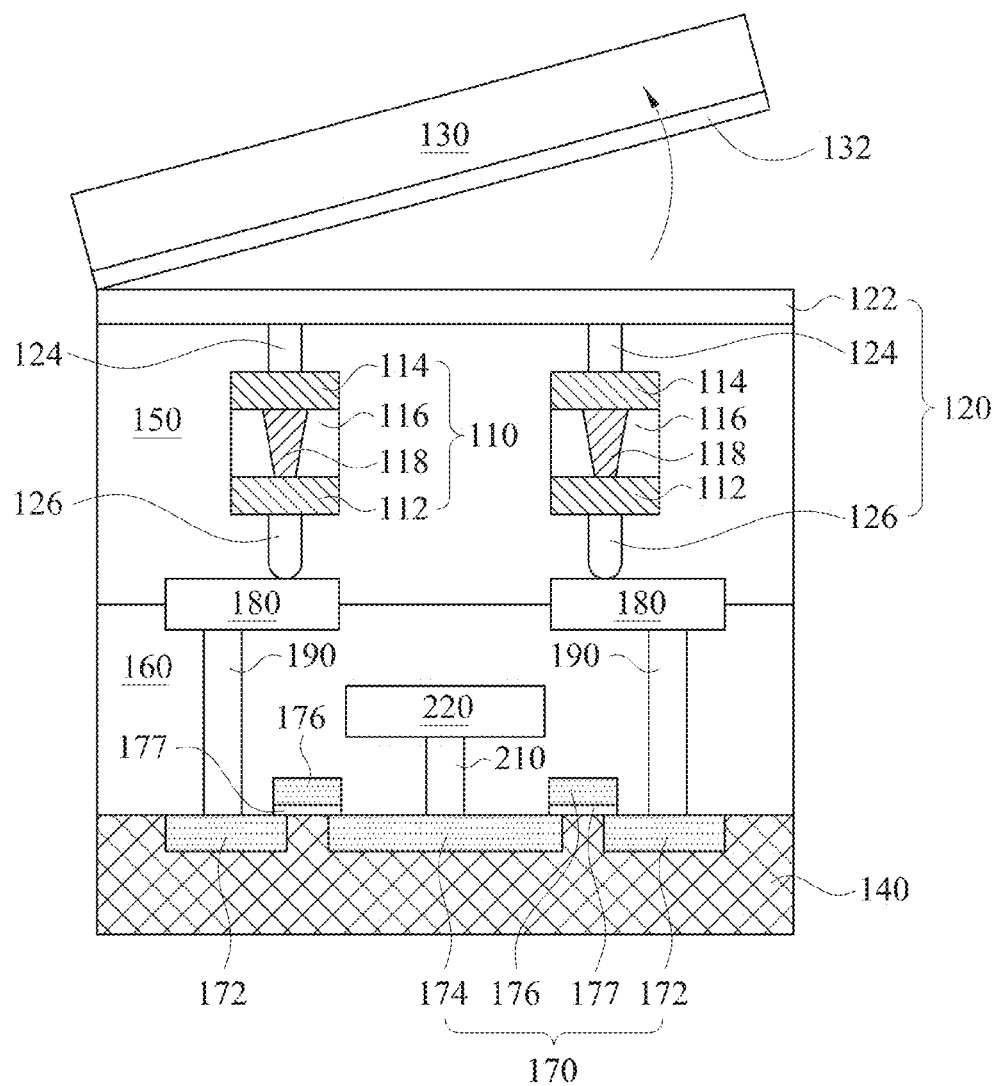
FIG. 7 is a schematic view of the portion of the resistive memory array shown in FIG. 6 in a subsequent stage of manufacture according to various embodiments of the present disclosure.

FIG. 7 is a schematic view of the portion of the resistive memory array shown in FIG. 6 in a subsequent stage of manufacture according to various embodiments of the present disclosure. As illustrated in FIG. 7, after the operation of bonding respectively the interconnect pads 180 and the contact points (the second vias) 126, the first substrate 130 is removed form the resistors 110 and the conductive structure 120. As aforementioned, the first substrate 130 may be regarded as a carrier substrate for the plurality of resistors 110 and the conductive structure 120. When the resistors 110 are respectively electrically connected to the transistors 170 by bonding respectively the interconnect pads 180 of the second substrate 140 and the contact points (the second vias) 126 on the first substrate 130, the first substrate 130 is removed to leave a 1T1R resistive memory array on the second substrate 140. Also as aforementioned, the passivation film 132 may be optionally disposed between the first conductive layer 122 of the conductive structure 120 and the first substrate 130 for easily removing the first substrate 130 from the conductive structure 120, and therefore both the passivation film 132 and the first substrate 130 may be removed from the first conductive layer 122 of the conductive structure 120.

Figure 8:
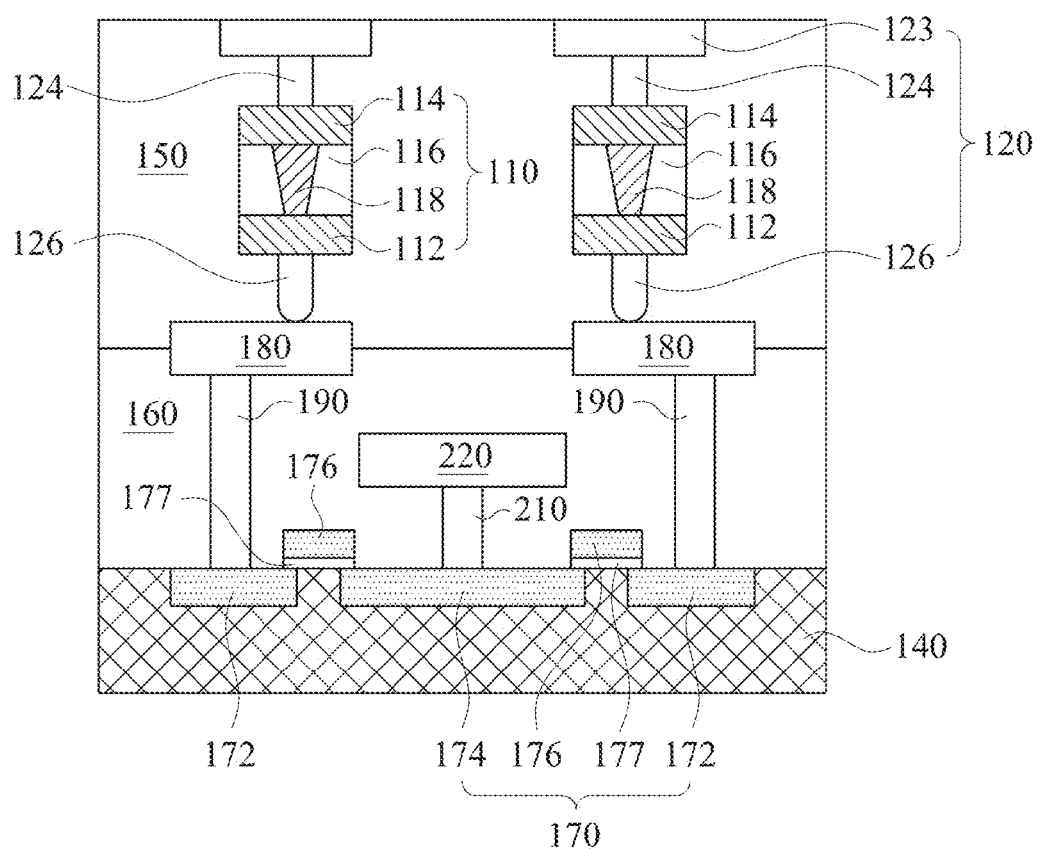
FIG. 8 is a schematic view of the portion of the resistive memory array shown in FIG. 7 in a subsequent stage of manufacture according to various embodiments of the present disclosure.

FIG. 8 is a schematic view of the portion of the resistive memory array shown in FIG. 7 in a subsequent stage of manufacture according to various embodiments of the present disclosure. As illustrated in FIG. 8, in some embodiments of the present disclosure, after the operation of removing the first substrate 130 from the resistors 110 and the conductive structure 120, the first conductive layer 122 is patterned to form individual conductive paths for each of the resistors 110. For example, the first conductive layer 122 is patterned to form a plurality of conductive pads 123. The conductive pads 123 are respectively electrical connected to the first vias 124. Referring to FIG. 8 and FIG. 2, the resistors 110 is individually electrically connected to the bit line 16 (labeled B1 or B2) through the conductive pads 123 respectively.

Figure 9:
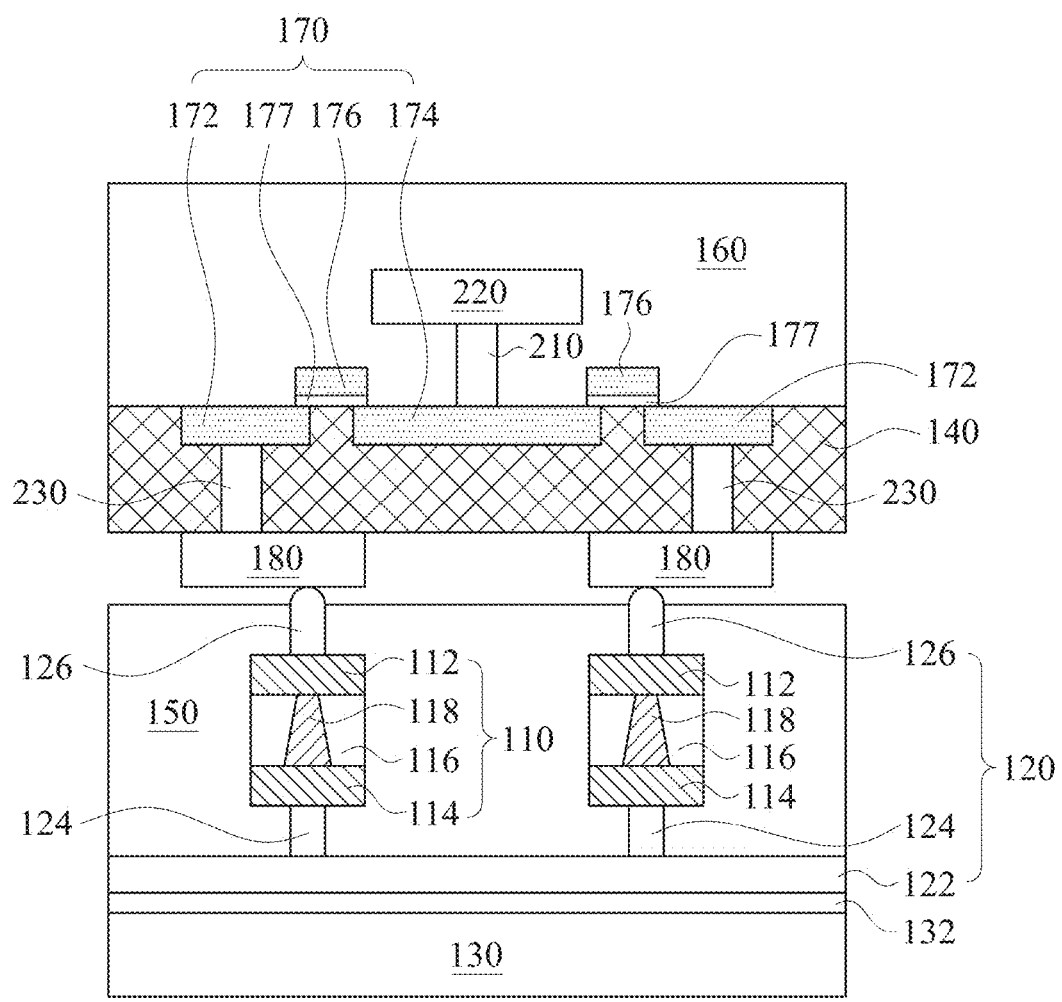
FIG. 9 is a schematic view of the portion of the resistive memory array shown in FIG. 5 in a subsequent stage of manufacture according to other embodiments of the present disclosure.

FIG. 9 is a schematic view of the portion of the resistive memory array shown in FIG. 5 in a subsequent stage of manufacture according to other embodiments of the present disclosure. As illustrated in FIG. 9, in the operation of providing the second substrate 140 having the transistors 170 and the interconnect pads 180 respectively electrically connected to the transistors, the interconnect pads 180 and the transistors 170 are formed at the opposite sides of the second substrate 140. The interconnect pads 180 and the transistors 170 are respectively electrically connected through a plurality of through silicon via 230. Therefore, the contact points (the second vias) 126 are not respectively bonded to the interconnect pads 180 from the upper side of the second substrate 140 as illustrated in FIG. 6-8, but being bonded respectively to the interconnect pads 180 from the lower side of the second substrate 140 as illustrated in FIG. 9. Accordingly, the electrical connection between the drain electrode 172 of the transistor 170 and the first electrode 112 of the resistor 110 is also established as those in previous embodiments. The through silicon via 230 may be made of conductive materials such as aluminum (Al), tungsten (W), copper (Cu), or other suitable conductive materials.

Figure 10:
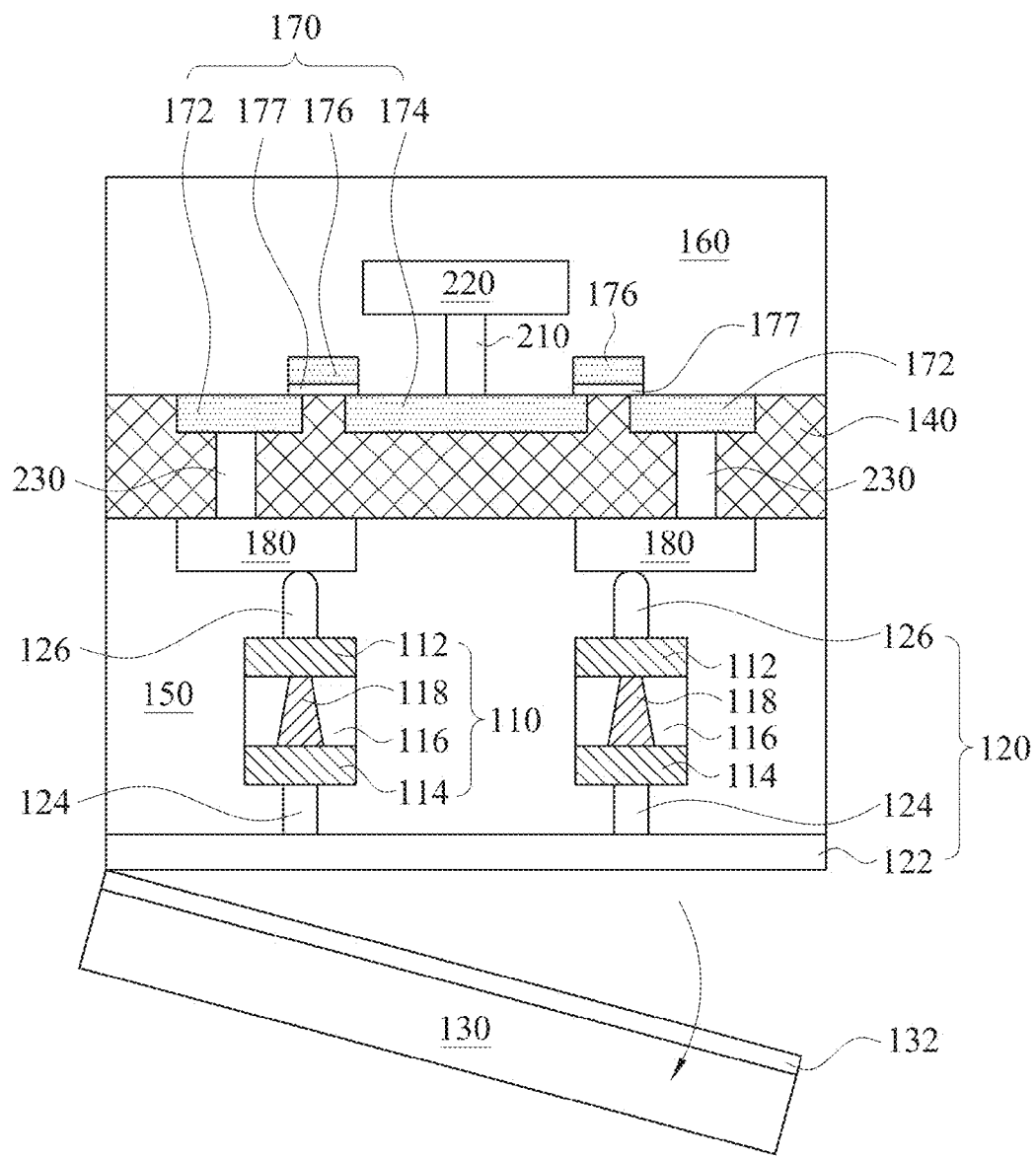
FIG. 10 is a schematic view of the portion of the resistive memory array shown in FIG. 9 in a subsequent stage of manufacture according to other embodiments of the present disclosure.

FIG. 10 is a schematic view of the portion of the resistive memory array shown in FIG. 9 in a subsequent stage of manufacture according to other embodiments of the present disclosure. As illustrated in FIG. 10, after the operation of bonding respectively the interconnect pads 180 and the contact points (the second vias) 126, the first substrate 130 is removed form the resistors 110 and the conductive structure 120. The first substrate 130 may be regarded as a carrier substrate for the resistors 110 and the conductive structure 120. When the resistors 110 are respectively electrically connected to the transistors 170 by bonding respectively the interconnect pads 180 of the second substrate 140 and the contact points (the second vias) 126 on the first substrate 130, the first substrate 130 is removed to leave a 1T1R resistive memory array on the second substrate 140. As aforementioned, the passivation film 132 may be optionally disposed between the first conductive layer 122 of the conductive structure 120 and the first substrate 130 for easily removing the first substrate 130 from the conductive structure 120, and therefore both the passivation film 132 and the first substrate 130 may be removed from the first conductive layer 122 of the conductive structure 120.

Figure 11:
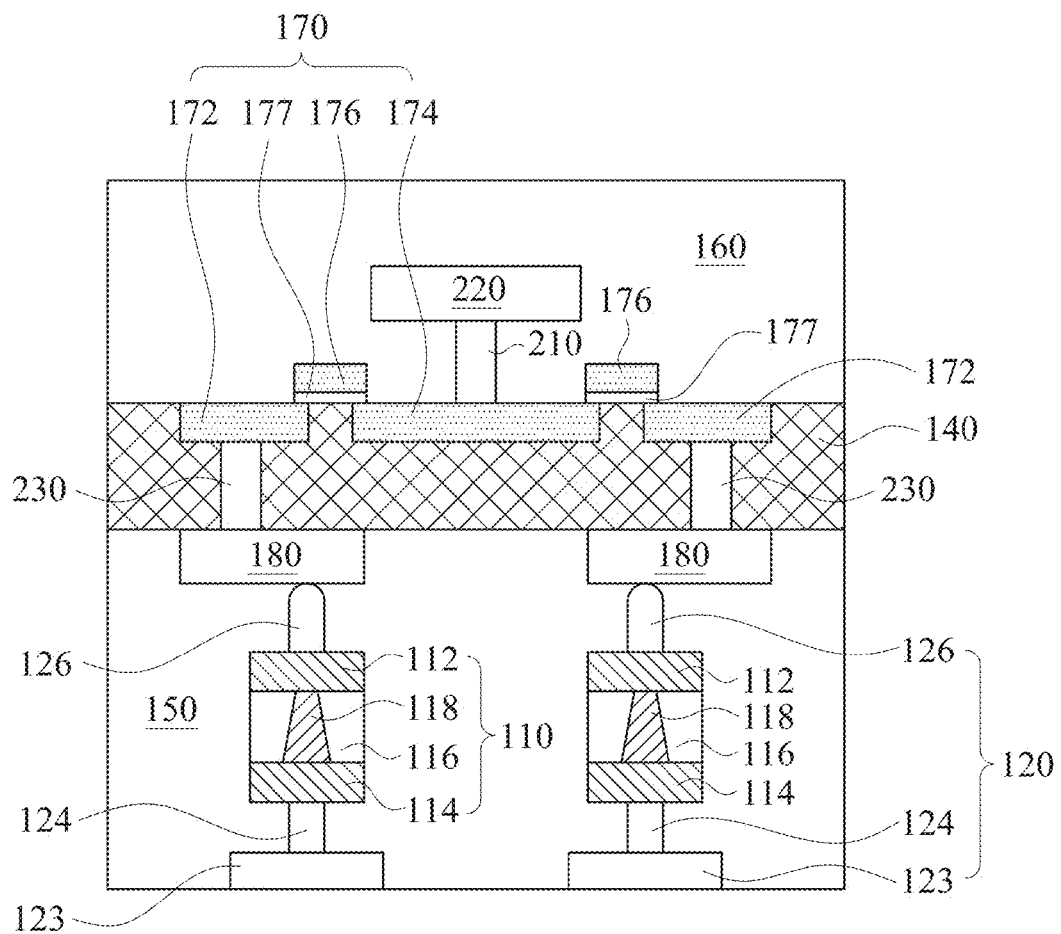
FIG. 11 is a schematic view of the portion of the resistive memory array shown in FIG. 10 in a subsequent stage of manufacture according to various embodiments of the present disclosure.

FIG. 11 is a schematic view of the portion of the resistive memory array shown in FIG. 10 in a subsequent stage of manufacture according to various embodiments of the present disclosure. As illustrated in FIG. 11, after the operation of removing the first substrate 130 from the resistors 110 and the conductive structure 120, the first conductive layer 122 is patterned to form individual conductive paths for each of the resistors 110. Similar to that illustrated in FIG. 8, the first conductive layer 122 is patterned to form the conductive pads 123. The conductive pads 123 are respectively electrically connected to the first vias 124. Referring to FIG. 11 and FIG. 2, the resistors 110 is individually electrically connected to the bit line 16 (labeled BL1 or BL2) through the conductive pads 123 respectively. As illustrated in FIG. 9, the 1T1R resistive memory array includes the silicon substrate 140, at least one transistor 170, the interconnect pad 180, at least one first via 124, at least one second via 126, the resistor 110, and the through silicon via 230 is fabricated. The transistor 170 is disposed on the silicon substrate 140. The interconnect pad 180 is electrically connected to the transistor 170. The resistor 110 is sandwiched by the first via 124 and the second via 126. The second via 126 is electrically connected to the interconnect pad 180. The through silicon via 230 is disposed in the silicon substrate 140. The silicon substrate 140 is sandwiched by the transistor 170 and the resistor 110, and the transistor 170 and the resistor 110 are electrically connected through the through silicon via 230.

It should be noticed that the operation of performing the resistor-forming process to transform the insulators 110' into the resistors 110 is performed before that of bonding respectively the interconnect pads 180 and the contact points (second vias 126). Since the conductive paths between the transistors 170 and the resistors 110 is established after the resistor-forming process, the concern of damaging the transistors 170 by the forming voltage 240, which is applied during the resistor-forming process, is eliminated. Furthermore, according to various embodiments of the present disclosure, the resistors 110 are formed on the first substrate 130 and the transistors 110 are disposed the second substrate 140. Therefore, the resistor-forming process is performed independently to the transistors 170 before the operation of bonding respectively the interconnect pads 180 (on the second substrate 140) and the contact points (the plurality of second vias 126 on the first substrate 130). Accordingly, the operation of forming the plurality of insulators 110' and the conductive structure 120 on the first substrate 130 can be performed in various ways to offer various advantages corresponding to different demands.

Figure 12:
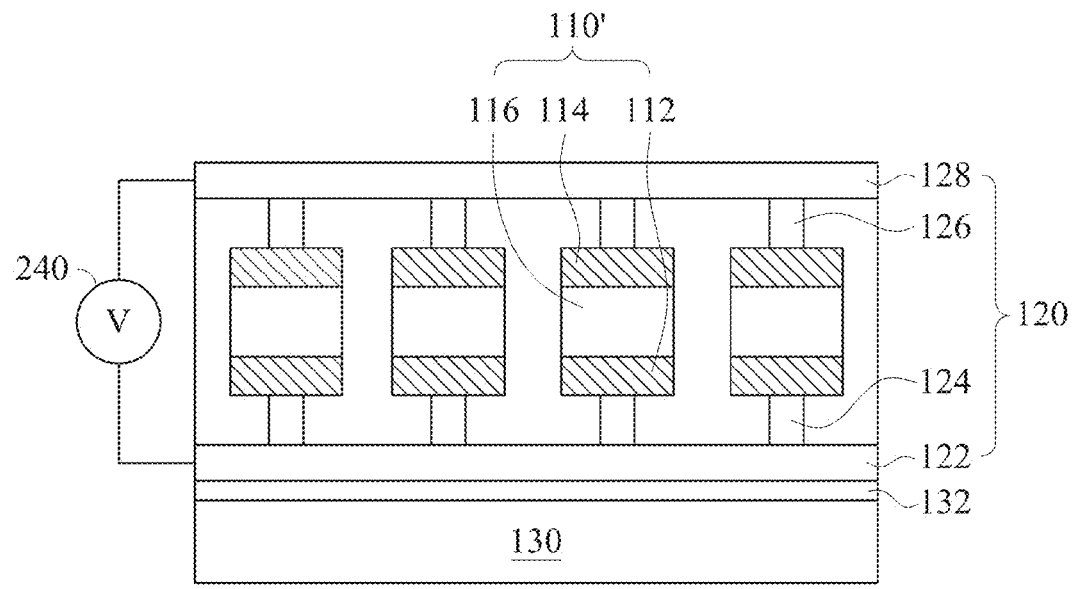
FIG. 12 is a schematic view of at least a portion of a resistive memory array in an intermediate stage of manufacturing according to various embodiments of the present disclosure.
Figure 13:
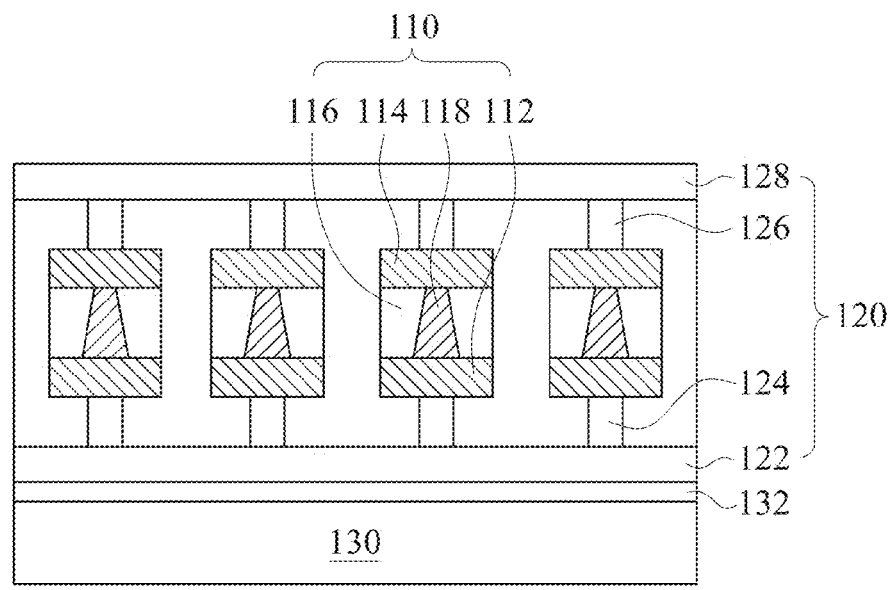
FIG. 13 is a schematic view of the portion of the resistive memory array shown in FIG. 12 in a subsequent stage of manufacture according to various embodiments of the present disclosure.

Referring to FIG. 12 and FIG. 13, FIG. 12 is a schematic view of at least a portion of a resistive memory array in an intermediate stage of manufacturing according to various embodiments of the present disclosure; FIG. 13 is a schematic view of the portion of the resistive memory array shown in FIG. 12 in a subsequent stage of manufacture according to various embodiments of the present disclosure. As illustrated in FIG. 12, the plurality of insulators 110' and the conductive structure 120 are formed on the first substrate 130. The insulators 110' are electrically connected to the conductive structure 120. In various embodiments of the present disclosure, the insulator 110' includes the first electrode 112, the second electrode 114, and the resistive element 116 disposed between the first electrode 112 and the second electrode 114. The conductive structure 120 includes the first conductive layer 122, the first vias 124, the second vias 126, and the second conductive layer 128. Materials of above elements and the connection between them are similar to those illustrated in FIG. 3, and therefore the details are omitted here. It should be noticed that the insulators 110' are electrically connected in parallel by the conductive structure 120. Therefore, the operation of the resistor-forming process can be performed in a simple and direct way to transform the insulators 110' into a plurality of resistors 110 by applying a forming voltage 240 through the first conductive layer 122 and the second conductive layer 128. Furthermore, since the insulators 110' are electrically connected in parallel by the conductive structure 120, each insulator 110' can be regarded as starting the resistor-forming process simultaneously. Therefore, the time of the resistor-forming process of the resistive memory array according to various embodiments of the present disclosure can be reduced. As shown in FIG. 13, when the insulators 110' are transformed into the resistors 110, the resistor-forming process is completed. The following steps including the operation of polishing the conductive structure 120, the operation of providing the second substrate 140, the operation of bonding respectively the interconnect pads 180 and the contact points (second vias 126), and the operation of removing the first substrate 130 are similar to those described and illustrated in FIG. 5-7, therefore the details are omitted here.

Figure 14:
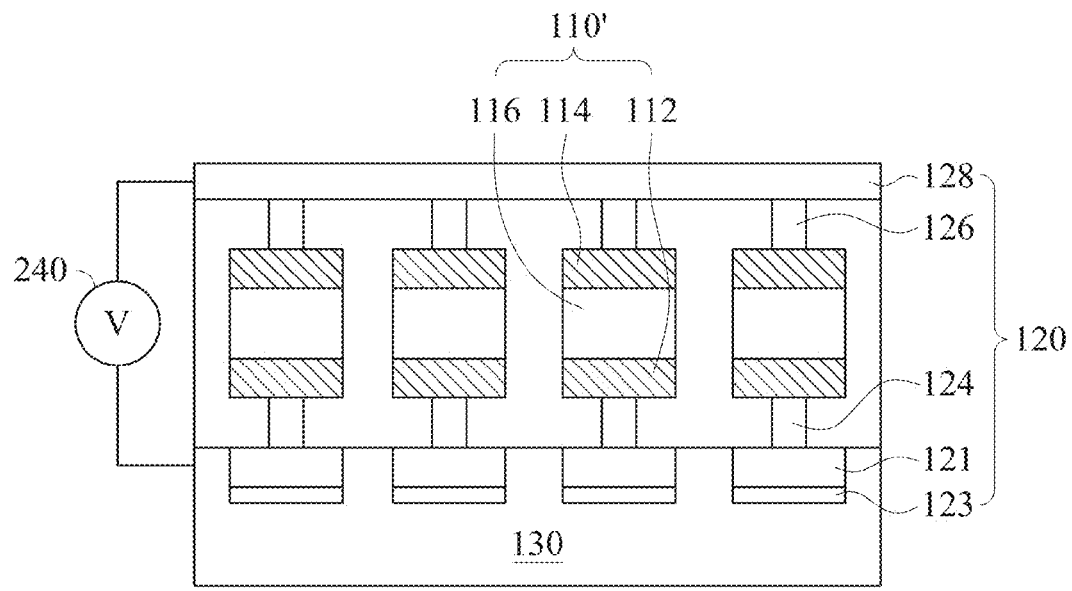
FIG. 14 is a schematic view of at least a portion of a resistive memory array in an intermediate stage of manufacturing according to various embodiments of the present disclosure.
Figure 15:
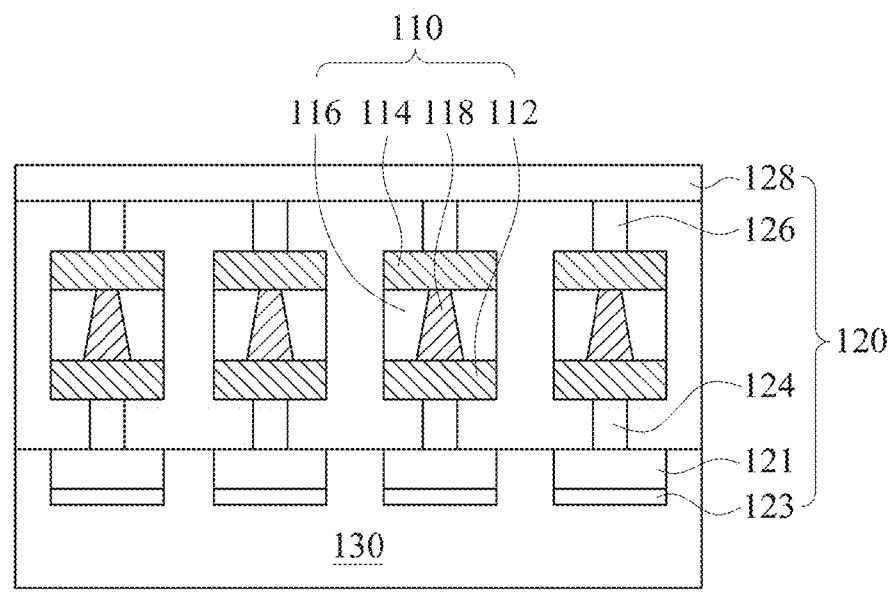
FIG. 15 is a schematic view of the portion of the resistive memory array shown in FIG. 14 in a subsequent stage of manufacture according to various embodiments of the present disclosure.

Referring to FIG. 14 and FIG. 15, FIG. 14 is a schematic view of at least a portion of a resistive memory array in an intermediate stage of manufacturing according to various embodiments of the present disclosure; FIG. 15 is a schematic view of the portion of the resistive memory array shown in FIG. 14 in a subsequent stage of manufacture according to various embodiments of the present disclosure. As illustrated in FIG. 14, a plurality of diodes 121, 123 are formed in the first substrate 130. The diode 121, 123 include, for example, a P type implant region 121 and a N type implant region 123 in the first substrate 130, however, the present disclosure is not limited to it. The diode 121, 123 may be any suitable current-limiting devices. The plurality of first vias 124 is individually formed on the diodes 121, 123. The first vias 124 are respectively electrically connected to the diodes 121, 123. The insulators 110' are formed on the first vias 124. The insulators 110' are respectively electrically connected to the first vias 124. The plurality of second vias 126 is formed on the plurality of insulators 110'. The second vias 126 is respectively electrically connected to the insulators 110'. The second conductive layer 128 is formed on the second vias 126 and electrically connected to the second vias 126. Materials of above elements and the connection between them are similar to those in previous embodiments, and therefore the details are omitted here. The difference is that the conductive structure 120 includes the diodes 121,123, the first vias 124, the second vias 126, and the second conductive layer 128. And the resistor-forming process illustrated in FIG. 14 is performed by applying the forming voltage 240 through the first conductive layer and the diodes 121,123. The insulators 110' are also electrically connected in parallel by the conductive structure 120, and each insulator 110' can also be regarded as starting the resistor-forming process simultaneously. Therefore, the time of the resistor-forming process of the resistive memory array according to various embodiments of the present disclosure can be reduced. Furthermore, as aforementioned, the diode 121, 123 may be any suitable current-limiting devices. It should be noticed that the insulators 110' illustrated in FIG. 14 are not electrically connected to a common conductive layer (as the first conductive layer illustrated in FIG. 12), but electrically connected to respective diodes 121, 123, and therefore the conductive paths of each insulators 110' will always possess certain resistance during the resistor-forming process regardless the insulator 110' has been transformed into the resistor 110 or not. Accordingly, each insulator 110' in parallel connection obtains adequate chances to receive certain voltage/current during the resistor-forming process without suffering the short-circuit issue while any one of the parallel connected insulators 110' has been transformed into the resistor 100 in advance. As shown in FIG. 15, when the insulators 110' are transformed into the resistors 110, the resistor-forming process is completed. The following step, the operation of polishing the conductive structure 120, is similar to that described in previous embodiments of the present disclosure and is performed by polishing the second conductive layer 128 away to expose the second vias 126 as the contact points. As to the operations of providing the second substrate 140, the operation of bonding the plurality of interconnect pads 180 and the plurality of contact points (second vias 126) respectively, and the operation of removing the first substrate 130 are similar to those described and illustrated in FIG. 5-7, therefore the details are omitted here. In various embodiments of the present disclosure, after the operation of removing the first substrate 130 further includes the operation of removing the diodes 121, 123 from the conductive structure 120 to form individual conductive paths for each of the resistors 110, and the resistive memory array as illustrated in FIG. 8 or FIG. 11 is fabricated.

Figure 16:
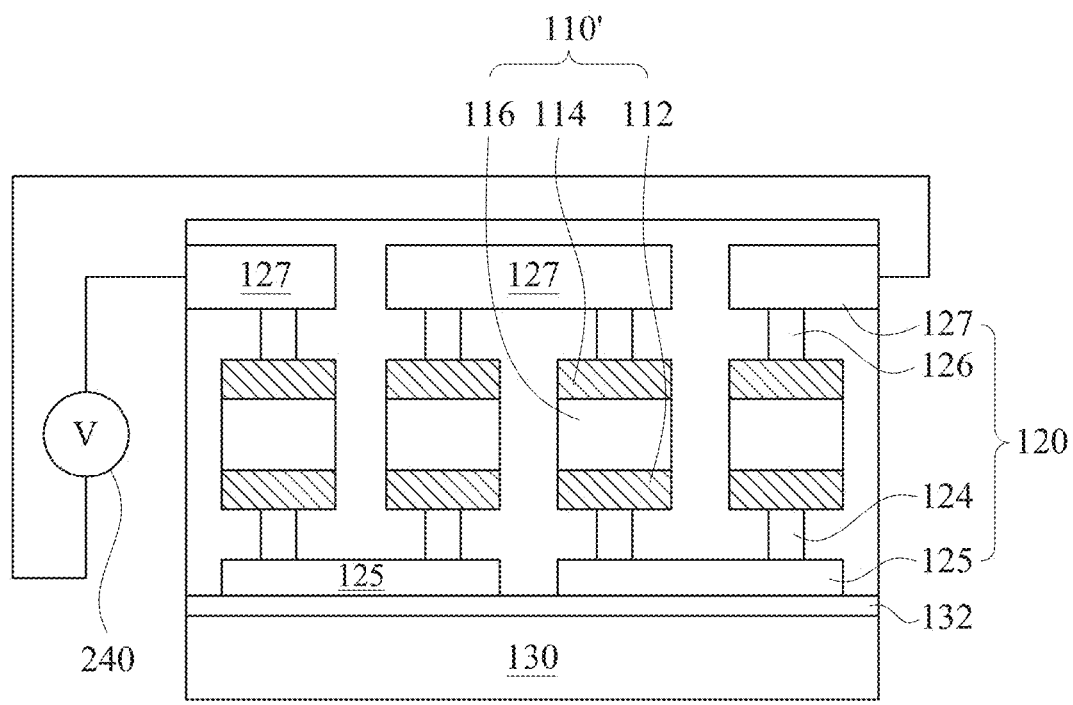
FIG. 16 is a schematic view of at least a portion of a resistive memory array in an intermediate stage of manufacturing according to various embodiments of the present disclosure.
Figure 17:
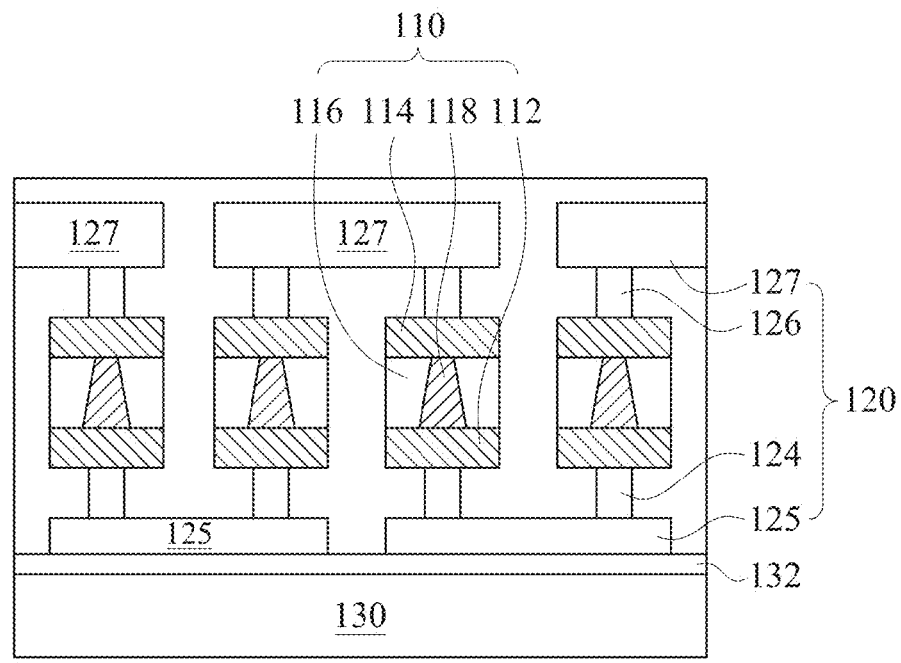
FIG. 17 is a schematic view of the portion of the resistive memory array shown in FIG. 16 in a subsequent stage of manufacture according to various embodiments of the present disclosure.

Referring to FIG. 16 and FIG. 17, FIG. 16 is a schematic view of at least a portion of a resistive memory array in an intermediate stage of manufacturing according to various embodiments of the present disclosure; FIG. 17 is a schematic view of the portion of the resistive memory array shown in FIG. 16 in a subsequent stage of manufacture according to various embodiments of the present disclosure. As illustrated in FIG. 16, a first conductive pattern 125 is formed on the first substrate 130. The plurality of first vias 124 is formed on the first conductive pattern 125. The first vias 124 are electrically connected to the first conductive pattern 125. The insulators 110' are formed on the first vias 124. The insulators 110' are respectively electrically connected to the plurality of first vias 124. The plurality of second vias 126 is formed on the insulators 110'. The second vias 126 are respectively electrically connected to the insulators 110'. A second conductive pattern 127 is formed on the second vias 126 and electrically connected to the second vias 126. Materials of above elements and the connection between them are similar to those in previous embodiments, and therefore the details are omitted here. The difference is that the conductive structure 120 includes the first conductive pattern 125, the first vias 124, the second vias 126, and the second conductive pattern 127. The first conductive pattern 125 and the second conductive pattern 127 may be formed by further performing litho-etching processes on the first conductive layer 122 and the second conductive layer 128 (as described and illustrated in FIG. 3) respectively. Therefore, the resistor-forming process illustrated in FIG. 16 is performed by applying the forming voltage 240 through the first conductive pattern 125. As shown in FIG. 16, it should be noticed that the insulators 110' are electrically connected in series by the conductive structure 120. Therefore, the operation of the resistor-forming process can be performed in a relatively lower current to transform the plurality of insulators 110' into a plurality of resistors 110 by applying a forming voltage 240 through the second conductive pattern 127.

As shown in FIG. 17, when the insulators 110' are transformed into the resistors 110, the resistor-forming process is completed. The following step, the operation of polishing the conductive structure 120, is performed by polishing the second conductive pattern 127 away to expose the second vias 126 as the contact points. As to the operations of providing the second substrate 140, the operation of bonding the plurality of interconnect pads 180 and the plurality of contact points (second vias 126) respectively, and the operation of removing the first substrate 130 are similar to those described and illustrated in FIG. 5-7, therefore the details are omitted here. In various embodiments of the present disclosure, after the operation of removing the first substrate 130 further includes removing the first conductive pattern 127 to form individual conductive paths for each of the resistors 110, and the resistive memory array as illustrated in FIG. 8 or FIG. 11 is fabricated.

Figure 18:
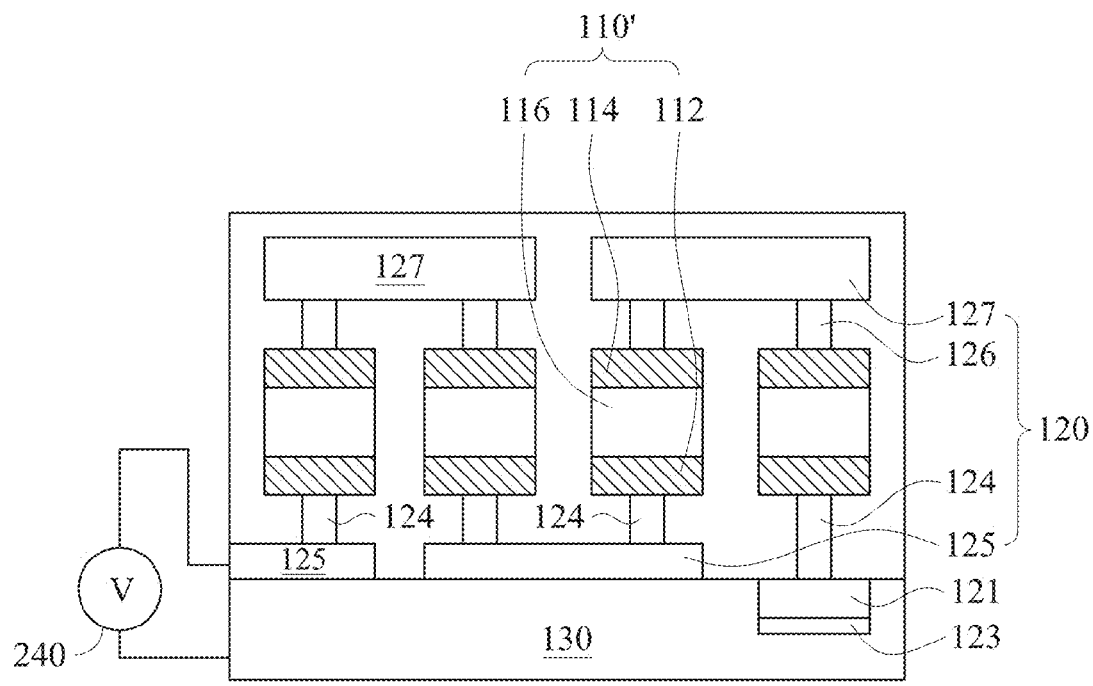
FIG. 18 is a schematic view of at least a portion of a resistive memory array in an intermediate stage of manufacturing according to various embodiments of the present disclosure.
Figure 19:
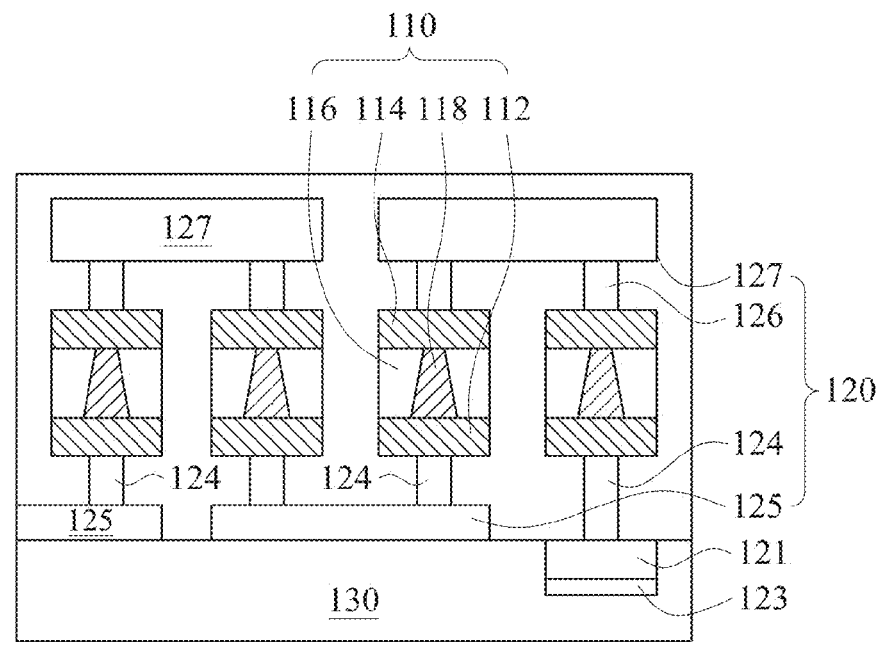
FIG. 19 is a schematic view of the portion of the resistive memory array shown in FIG. 18 in a subsequent stage of manufacture according to various embodiments of the present disclosure.

Referring to FIG. 18 and FIG. 19, FIG. 18 is a schematic view of at least a portion of a resistive memory array in an intermediate stage of manufacturing according to various embodiments of the present disclosure; FIG. 19 is a schematic view of the portion of the resistive memory array shown in FIG. 18 in a subsequent stage of manufacture according to various embodiments of the present disclosure. As illustrated in FIG. 18, a plurality of first conductive patterns 125 is formed on the first substrate 130. A plurality of diodes 121, 123 is formed in the first substrate 130. The plurality of first vias 124 formed on the first conductive patterns 125 and the diodes 121,123. The first vias 124 are respectively electrically connected to the first conductive patterns 125 and the diodes 121,123. The insulators 110' are formed on the first vias 124. The insulators 110' are respectively electrically connected to the first vias 124. The plurality of second vias 126 is formed on the insulators 110'. The second vias 126 are electrically connected to the plurality of insulators 110' respectively. A plurality of second conductive patterns 127 is formed on the second vias 126 and electrically connected to the second vias 126. Materials of above elements and the connection between them are similar to those in previous embodiments, and therefore the details are omitted here. The difference is that the conductive structure 120 includes the first conductive patterns 125, the diodes 121,123, the first vias 124, the second vias 126, and the second conductive patterns 127. The first conductive patterns 125 and the second conductive patterns 127 may be formed by further performing litho-etching processes on the first conductive layer 122 and the second conductive layer 128 (as described and illustrated in FIG. 3) respectively. Therefore, the resistor-forming process illustrated in FIG. 18 is performed by applying the forming voltage 240 through the plurality of first conductive patterns 125 and the diodes 121,123. As shown in FIG. 18, it should be noticed that the insulators 110' are electrically connected into a plurality of resistor-series by the conductive structure 120, and the resistor-series are electrically connected in parallel by the conductive structure 120. Therefore, comparing to the previous embodiments which all insulators 110' are electrically connected in parallel (as illustrated in FIG. 12 and FIG. 14), the operation of the resistor-forming process can be performed in a relatively lower current to transform the plurality of insulators 110' into a plurality of resistors 110; comparing to the previous embodiments which all insulators 110' are electrically connected in series (as illustrated in FIG. 16), less time is required to complete the resistor-forming process.

As shown in FIG. 19, when the insulators 110' is transformed into the resistors 110, the resistor-forming process is completed. The following step, the operation of polishing the conductive structure 120, is performed by polishing the second conductive patterns 127 away to expose the second vias 126 as the plurality of contact points. As to the operations of providing the second substrate 140, the operation of bonding respectively the interconnect pads 180 and the contact points (second vias 126), and the operation of removing the first substrate 130 are similar to those described and illustrated in FIG. 5-7, therefore the details are omitted here. In various embodiments of the present disclosure, after the operation of removing the first substrate 130 further includes removing the diodes 121, 123 and the first conductive patterns 125 from the conductive structure 120 to form individual conductive paths for each of the plurality of resistors 110, and the resistive memory array as illustrated in FIG. 8 or FIG. 11 is fabricated.

According to various embodiments (as illustrated from FIG. 12 to FIG. 19) of the present disclosure, it is apparently to conclude that the operation of forming the plurality of insulators 110' and the conductive structure 120 on the first substrate 130 can be performed in various ways to offer various advantages corresponding to different demands. Since the resistor-forming process is performed independently to the transistors 110 according to various embodiments of the present disclosure, the operation of forming the plurality of insulators 110' and the conductive structure 120 on the first substrate 130 can be flexible and easily adjusted to gain various advantages, such as lower current driving or time saving, as illustrated from FIG. 12 to FIG. 19. However, the present disclosure is not limited thereto.

Figure 20:
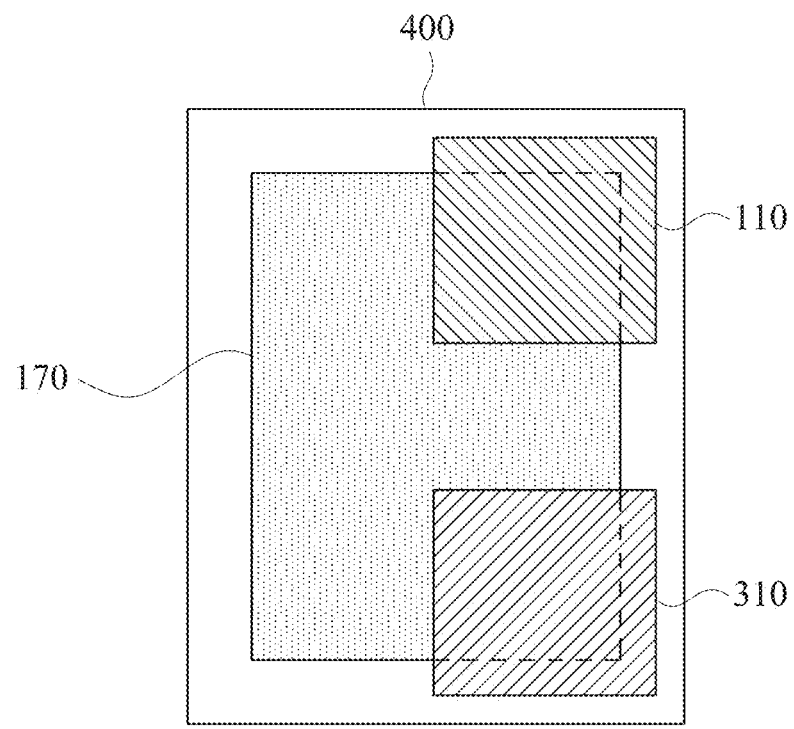
FIG. 20 is a schematic top-view of a cell of a resistive memory array according to various embodiments of the present disclosure.
Figure 21:
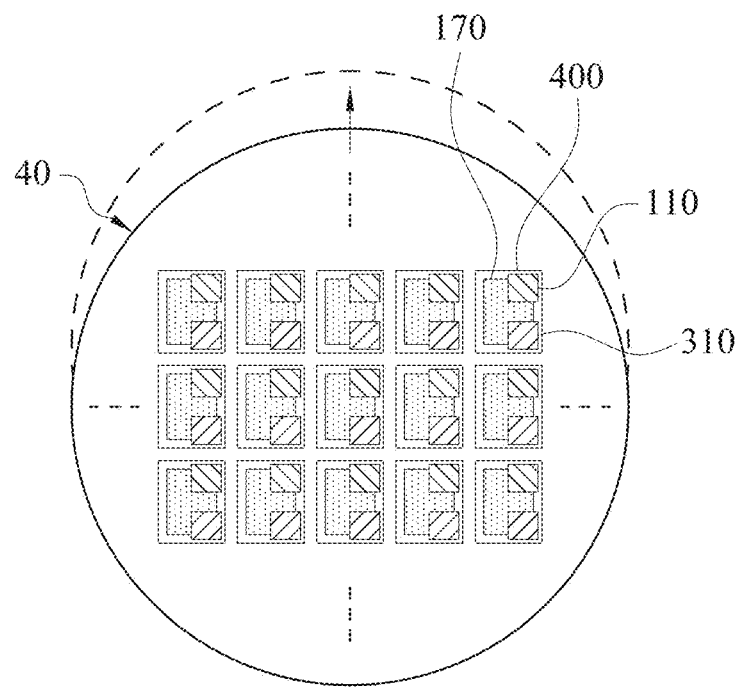
FIG. 21 illustrates a schematic top-view of the resistive memory array including a plurality of cells according to various embodiments of the present disclosure.

Referring to FIG. 20 and FIG. 21, FIG. 20 is a schematic top-view of a cell 400 of a resistive memory array according to various embodiments of the present disclosure; FIG. 21 illustrates a schematic top-view of the resistive memory array 40 including a plurality of cells 400 according to various embodiments of the present disclosure. As illustrated in FIG. 20, in the cell 400 of the resistive memory array 40 according to various embodiments of the present disclosure, the area of the resistor 110 is less than that of the transistor 170. Therefore, the amount of resistors formed on the first substrate can be greater than that of transistors on the second substrate. Accordingly, another plurality of resistors may be formed as the backup array of resistors if the predetermined array of resistors, which is predetermined to combine with the array of transistors, is failed during the processes of manufacturing, for example, the resistor-forming process. In various embodiments of the present disclosure, the operation of forming the plurality of insulators 110' and the conductive structure 120 on the first substrate 130 further includes forming a plurality of backup insulators on the first substrate. The plurality of backup insulators are disposed at the same level of the resistor, and is also electrically connected to the conductive structure. In the following step, the operation of performing the resistor-forming process, both of the plurality of insulators and the plurality of backup insulators are transformed into the plurality of resistors 110 and the plurality of backup resistors 310 respectively as illustrated in FIG. 20. As to the operations of polishing the conductive structure, the operation of providing the second substrate, the operation of bonding the plurality of interconnect pads and the plurality of contact points respectively, and the operation of removing the first substrate are similar to those described and illustrated in FIG. 5-7, therefore the details are omitted here. As illustrated in FIG. 21, it should be noticed that two arrays of the resistors (the plurality of resistors 110 and the plurality of resistors 310) are ready to combine with the array of transistors 170. When the predetermined array of resistors (the plurality of resistors 110) is failed or suffered low yield issue, the backup array of resistors (the plurality of resistors 310) can be a substitution of the predetermined array of resistors to combine with the plurality of transistors 170 on the other substrate. Accordingly, the yield of the resistive memory array according to various embodiments of the present disclosure can be further improved.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a resistive memory array, comprising:
    forming a plurality of insulators and a conductive structure on a first substrate, wherein the insulators are electrically connected to the conductive structure;
    performing a resistor-forming process to transform the insulators into a plurality of resistors by applying a forming voltage through the conductive structure;
    polishing the conductive structure to expose a plurality of contact points respectively electrically connected to the resistors;
    providing a second substrate having a plurality of transistors and a plurality of interconnect pads respectively electrically connected to the transistors;
    bonding respectively the interconnect pads and the contact points; and
    removing the first substrate from the resistors and the conductive structure.

2. The method of claim 1, wherein forming the insulators and the conductive structure on the first substrate comprises:
    forming a first conductive layer on the first substrate;
    forming a plurality of first vias on the first conductive layer, wherein the plurality of first vias are electrically connected to the first conductive layer;
    forming the insulators on the first vias, wherein the insulators are respectively electrically connected to the first vias;
    forming a plurality of second vias on the insulators, wherein second vias are respectively electrically connected to the insulators; and
    forming a second conductive layer on the second vias and electrically connected to the second vias, wherein the conductive structure includes the first conductive layer, the first vias, the second vias, and the second conductive layer, the insulators are electrically connected in parallel by the conductive structure.

3. The method of claim 2, wherein performing the resistor-forming process is performed by applying the forming voltage through the first and second conductive layers, and the operation of polishing the conductive structure is performed by polishing the second conductive layer away to expose the second vias as the contact points.

4. The method of claim 3, further comprising:
    patterning the first conductive layer to form individual conductive paths for each of the resistors.

5. The method of claim 2, further comprising forming a passivation film between the first conductive layer and the first substrate.

6. The method of claim 5, wherein the passivation film is simultaneously removed when removing the first substrate from the resistors and the conductive structure.

7. The method of claim 2, further comprising forming a first dielectric film covering the first vias, the insulators and the second vias.

8. The method of claim 2, wherein forming the insulators on the first vias comprises:
    forming first electrodes;
    forming resistive elements respectively on the first electrodes; and
    forming second electrodes respectively on the second electrodes.

9. The method of claim 8, wherein the resistor-forming process is performed to form conductive pathways respectively in the resistive elements.

10. The method of claim 1, wherein the area of the resistor is less than that of the transistor.

11. The method of claim 10, wherein forming the insulators and the conductive structure on the first substrate further comprises:
forming a plurality of backup insulators, wherein the backup insulators are electrically connected to the conductive structure.

12. The method of claim 1, wherein the interconnect pads and the transistors are formed at the same side of the second substrate.

13. The method of claim 12, further comprising a second dielectric film covering the transistors.

14. The method of claim 13, further comprising pad-connecting vias though the second dielectric film, and the interconnect pads being formed on the pad-connecting vias, respectively.

15. A method of fabricating a resistive memory array, comprising:
forming a plurality of insulators and a conductive structure on a first substrate, and the insulators being electrically connected to the conductive structure;
transforming the insulators into a plurality of resistors by applying a forming voltage through the conductive structure;
forming a plurality of transistors and a plurality of interconnect pads on a second substrate, and the interconnect pads being respectively electrically connected to the transistors;
removing a portion of the conductive structure to form a plurality of contact points respectively electrically connected to the resistors;
bonding respectively the interconnect pads and the contact points; and
removing the first substrate.

16. The method of claim 15, wherein the insulators comprises:
first electrodes;
resistive elements respectively on the first electrodes; and
second electrodes respectively on the second electrodes, and the conductive pathways being respectively formed in the resistive elements.

17. The method of claim 15, wherein the conductive structure comprises:
a first conductive layer on the first substrate;
a plurality of first vias between the first conductive layer and the insulators;
a plurality of second vias on the insulators; and
second conductive layer on the second vias.

18. The method of claim 17, wherein removing a portion of the conductive structure comprises:
polishing the second conductive layer away to expose the second vias as the contact points.

19. The method of claim 17, further comprising a passivation film between the first conductive layer and the first substrate, and the passivation film being simultaneously removed when removing the first substrate.

* * * * *